(12) United States Patent
Hsieh

(10) Patent No.: US 7,555,132 B2
(45) Date of Patent: Jun. 30, 2009

(54) APPARATUS AND METHOD FOR ADJUSTING SOUND VOLUME FOR TELEVISIONS AND OTHER AUDIO SYSTEMS

(75) Inventor: Kuan-Hong Hsieh, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 911 days.

(21) Appl. No.: 10/955,455

(22) Filed: Sep. 30, 2004

(65) Prior Publication Data

US 2005/0190931 A1   Sep. 1, 2005

(30) Foreign Application Priority Data

Feb. 28, 2004   (CN) .................. 2004 1 0015600

(51) Int. Cl.
H03G 7/00   (2006.01)

(52) U.S. Cl. .................. 381/109; 381/104; 348/738

(58) Field of Classification Search ......... 381/104–109, 381/123; 348/738
See application file for complete search history.

(56) References Cited

U.S. PATENT DOCUMENTS

| | | | | |
|---|---|---|---|---|
| 4,000,370 A | * | 12/1976 | Smith et al. | 381/104 |
| 4,170,720 A | * | 10/1979 | Killion | 381/321 |
| 4,937,672 A | * | 6/1990 | Anderson | 348/554 |
| 5,130,665 A | | 7/1992 | Walden | 330/129 |
| 5,144,675 A | * | 9/1992 | Killion et al. | 381/321 |
| 5,410,265 A | * | 4/1995 | Jain et al. | 330/2 |
| 5,781,848 A | * | 7/1998 | Komoda | 455/72 |
| 5,805,713 A | * | 9/1998 | Pritchard | 381/61 |
| 5,896,458 A | * | 4/1999 | Werrbach | 381/108 |
| 5,923,767 A | * | 7/1999 | Frindle et al. | 381/106 |
| 6,061,455 A | * | 5/2000 | Hadley et al. | 381/57 |
| 6,195,439 B1 | * | 2/2001 | Fukui | 381/104 |
| 6,442,279 B1 | * | 8/2002 | Preves et al. | 381/72 |
| 6,552,753 B1 | * | 4/2003 | Zhurbinskiy et al. | 348/738 |

* cited by examiner

*Primary Examiner*—Vivian Chin
*Assistant Examiner*—Disler Paul

(57) ABSTRACT

An apparatus (10) for adjusting sound volume for an audio system includes a controller (101) connected to an amplifier (40) of the audio system for controlling amplification of the amplifier, and a first circuit (102) for adjusting the sound volume. The controller includes a microprogrammed control unit (1010), a random-access memory (1012), and an electrically erasable programmable read-only memory (1014). The first circuit includes an attenuation circuit (1022) connected to a tuner of the audio system for attenuating input audio signals, and a switch (1024). An input end of the switch is connected to the tuner and an output end of the attenuation circuit, and an output end of the switch is connected to an audio processor (30) of the audio system. The apparatus enables a user to freely adjust an average level of sound produced by the audio system, and simultaneously avoid being bothered by loud transmissions.

19 Claims, 4 Drawing Sheets

APPARATUS AND METHOD FOR ADJUSTING SOUND VOLUME FOR TELEVISIONS AND OTHER AUDIO SYSTEMS

CROSS-REFERENCE TO RELATED APPLICATIONS

This application is related to a copending U.S. patent application entitled "APPARATUS AND METHOD FOR ADJUSTING SOUND VOLUME FOR TELEVISIONS AND OTHER AUDIO SYSTEMS", filed on the same day with the same applicant and assignee as the invention. The disclosure of the above identified application is incorporated herein by reference.

BACKGROUND OF THE INVENTION

1. Field of the Invention

The present invention relates to apparatuses and methods for adjusting and attenuating sound volume for televisions and other audio systems.

2. Description of Prior Art

At times, a television or radio may broadcast an unexpected, noisy transmission to a user due to a programming change or when there are problems with reception. For example, a television or radio program provider may intentionally broadcast an advertisement at an abruptly high volume so as to attract a user's attention. On other occasions, signals received by the television or radio may be interfered with by signals transmitted by other electronic devices, thereby generating static or other unwanted transmissions. Loud advertisements or unexpected noises are perhaps least likely to bother the user during the daytime or in an environment that is otherwise relatively noisy. However, the user is likely to be easily bothered late at night or in a relatively quiet environment.

In order to overcome the above-mentioned problem, U.S. Pat. No. 5,130,665, issued on Jul. 14, 1992, discloses an audio volume controller. When the audio volume controller is in a control mode, the audio volume controller outputs audio signals whose volumes are between a predefined minimum volume and a predefined maximum volume. That is, the audio volume controller cannot output any audio signal whose volume is higher than the predefined maximum volume. This enables the user to avoid being bothered by loud noises. However, the user cannot freely adjust the average level of the sound produced by the audio volume controller in the control mode unless he/she switches the audio volume controller to exit the control mode. Thus, it is not convenient for the user to use the audio volume controller.

SUMMARY OF THE INVENTION

Accordingly, a primary object of the present invention is to provide an apparatus for facilitating a user to not only freely adjust an average level of sound produced by an audio system according to his/her particular requirements, but also simultaneously avoid being bothered by loud transmissions.

A second object of the present invention is to provide a method for facilitating a user to not only freely adjust an average level of sound produced by an audio system according to his/her particular requirements, but also simultaneously avoid being bothered by loud transmissions.

In order to fulfill the above-mentioned primary object, the present invention provides an apparatus for adjusting sound volume for an audio system. The apparatus comprises a controller connected to an amplifier of the audio system for controlling amplification of the amplifier, and a first circuit for adjusting the sound volume. The controller comprises a microprogrammed control unit (MCU). The first circuit comprises an attenuation circuit for attenuating input audio signals, and a first switch. The attenuation circuit comprises: a first resistance, one end of the first resistance being connected to a tuner of the audio system; a second resistance, one end of the second resistance being connected to another end of the first resistance, and another end of the second resistance being grounded; a third resistance, one end of the third resistance being connected to the other end of the first resistance; a first diode, the cathode of the first diode being connected to another end of the third resistance, and the anode of the first diode being grounded; and a second diode, the anode of the second diode being connected to the other end of the third resistance, and the cathode of the second diode being grounded. An input end of the first switch is connected to the tuner of the audio system and the other end of the first resistance, and an output end of the first switch is connected to an audio processor of the audio system.

In order to fulfill the above-mentioned second object, the present invention provides a method for adjusting sound volume for an audio system. The method comprises the following steps: (a) determining whether an apparatus for adjusting sound volume is in an attenuation mode; (b) controlling a first switch to switch a circuit for adjusting sound volume to an attenuation mode, if the apparatus for adjusting sound volume is in the attenuation mode; (c) attenuating an input audio signal, the input audio signal traveling through a first resistance and a second resistance if a first diode and a second diode do not allow the input audio signal through; and (d) repeating steps (a) through (c) until the audio system is turned off.

Other objects, advantages and novel features of the present invention will become more apparent from the following detailed description when taken in conjunction with the accompanying drawings, in which:

DETAILED DESCRIPTION OF THE INVENTION

Figure 1:
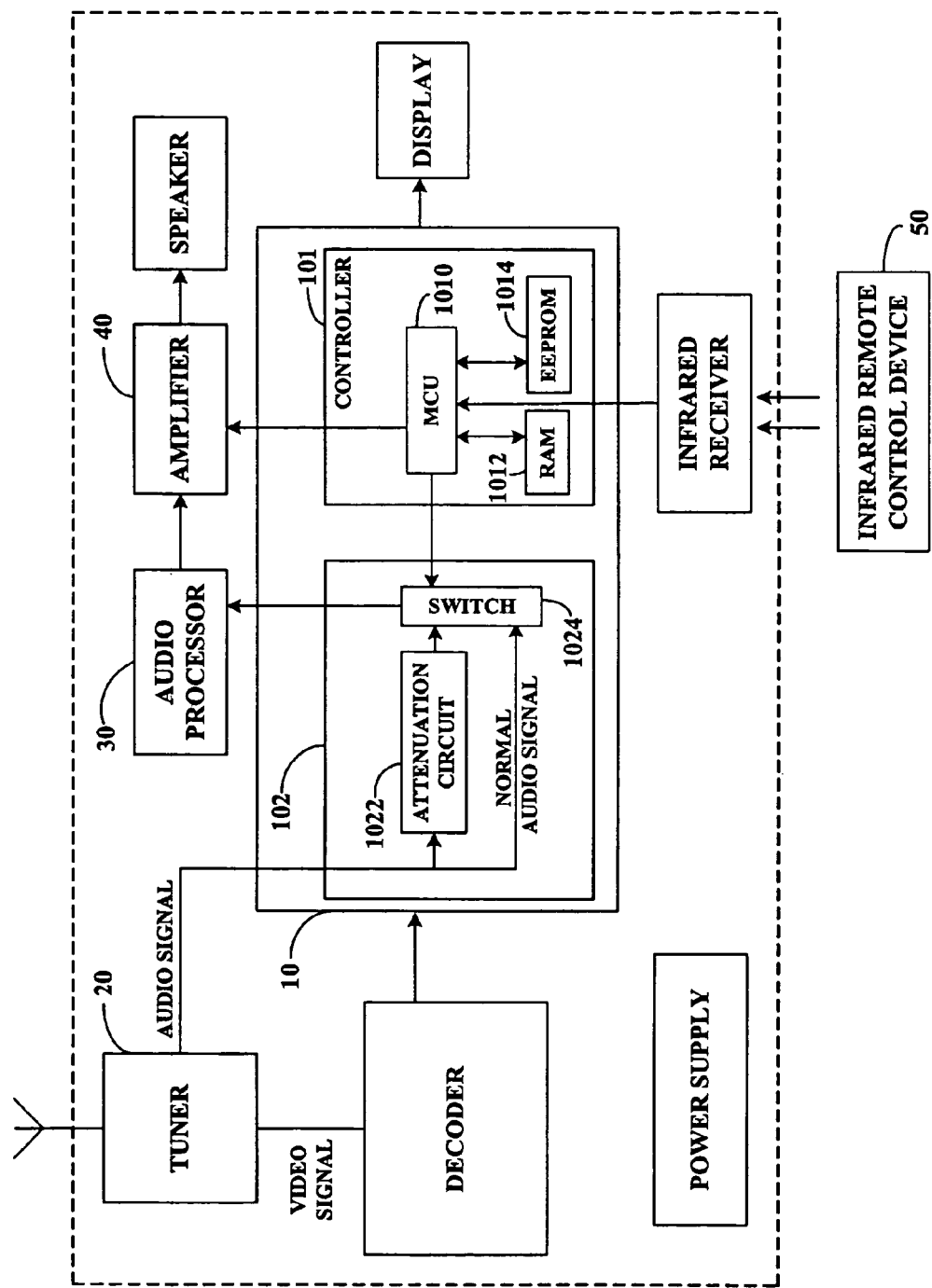
FIG. 1 is a simplified block diagram of part of a television having an apparatus for adjusting sound volume according to the present invention.

FIG. 1 is a simplified block diagram of part of a television having an apparatus 10 for adjusting sound volume according to the present invention. The apparatus 10 can run in either of two operating modes: a normal mode and an attenuation mode. A viewer switches the apparatus 10 to either one of the above-mentioned operating modes by use of an infrared remote control device 50 or a functional key (not shown) on the television itself. The apparatus 10 comprises a controller 101, and a circuit 102 for adjusting sound volume. The controller 101 comprises a microprogrammed control unit (MCU) 1010, a Random-Access Memory (RAM) 1012, and an Electrically Erasable Programmable Read-Only Memory (EEPROM) 1014. The RAM 1012 and the EEPROM 1014 communicate with the MCU 1010. The controller 101 controls amplification of an amplifier 40 of the television. In other exemplary embodiments, the EEPROM 1014 may be replaced by any other suitable nonvolatile memory, such as a Read-Only Memory (ROM), an Erasable and Programmable Read-Only Memory (EPROM) or a flash memory.

The operating mode of the circuit 102 corresponds to the operating mode of the apparatus 10. When the apparatus 10 is in the normal mode, the circuit 102 is also in a normal mode; similarly, when the apparatus 10 is in the attenuation mode, the circuit 102 is also in an attenuation mode. The circuit 102 comprises an attenuation circuit 1022, and a switch 1024 for switching the operating mode of the circuit 102. Input ends of the attenuation circuit 1022 and the switch 1024 are connected to a tuner 20 of the television. The output end of the attenuation circuit 1022 is connected to an input end of the switch 1024. The MCU 1010 is connected to the switch 1024, for controlling the switch 1024 to switch the operating mode of the circuit 102 according to the operating mode of the apparatus 10. The switch 1024 is connected to an audio processor 30, for outputting thereto unadjusted audio signals or audio signals attenuated by the attenuation circuit 1022.

Figure 2:
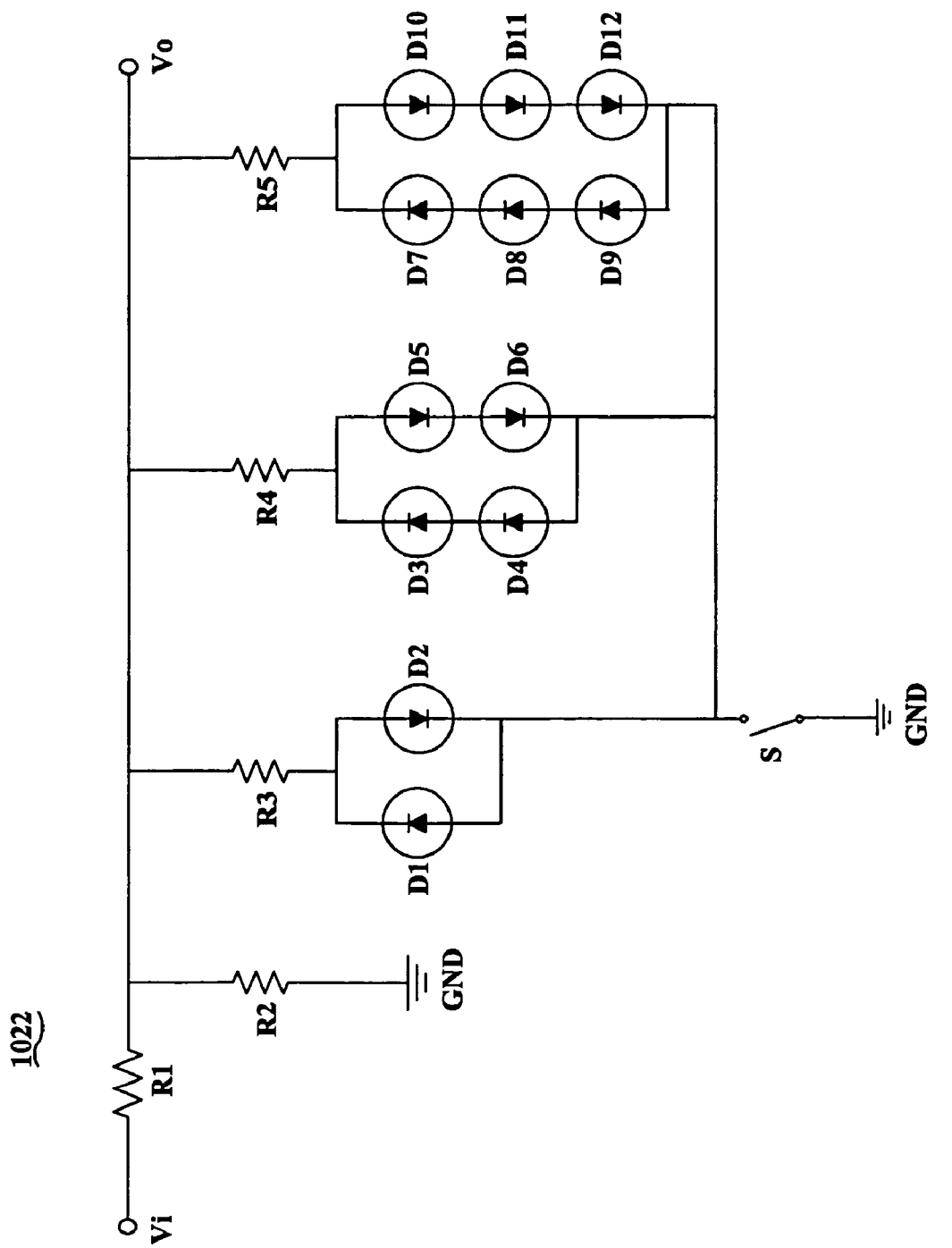
FIG. 2 is a circuit diagram of an attenuation circuit of the apparatus of FIG. 1.

FIG. 2 is a circuit diagram of the attenuation circuit 1022. In the present embodiment, the attenuation circuit 1022 comprises a mechanical switch S, five resistances R1, R2, R3, R4, R5, and twelve diodes D1, D2, D3, D4, D5, D6, D7, D8, D9, D10, D11, D12. An input end of the resistance R1 is connected to the tuner 20 of the television. The switch 1024 (see FIG. 1) and input ends of the other four resistances R2, R3, R4, R5 are connected to an output end of the resistance R1 in parallel. An output end of the resistance R2 is grounded. An output end of the resistance R3 is connected to the cathode of the diode D1 and the anode of the diode D2. An output end of the resistance R4 is connected to the cathode of the diode D3 and the anode of the diode D5. The anode of the diode D3 is connected to the cathode of the diode D4, and the cathode of the diode D5 is connected to the anode of the diode D6. An output end of the resistance R5 is connected to the cathode of the diode D7 and the anode of the diode D10. The anode of the diode D7 is connected to the cathode of the diode D8, whose anode is connected to the cathode of the diode D9. The cathode of the diode D10 is connected to the anode of the diode D11, whose cathode is connected to the anode of the diode D12. The anode of the diode D1, the cathode of the diode D2, the anode of the diode D4, the cathode of the diode D6, the anode of the diode D9 and the cathode of the diode D12 are connected to one end of the mechanical switch S in parallel. The other end of the mechanical switch S is grounded.

Figure 3:
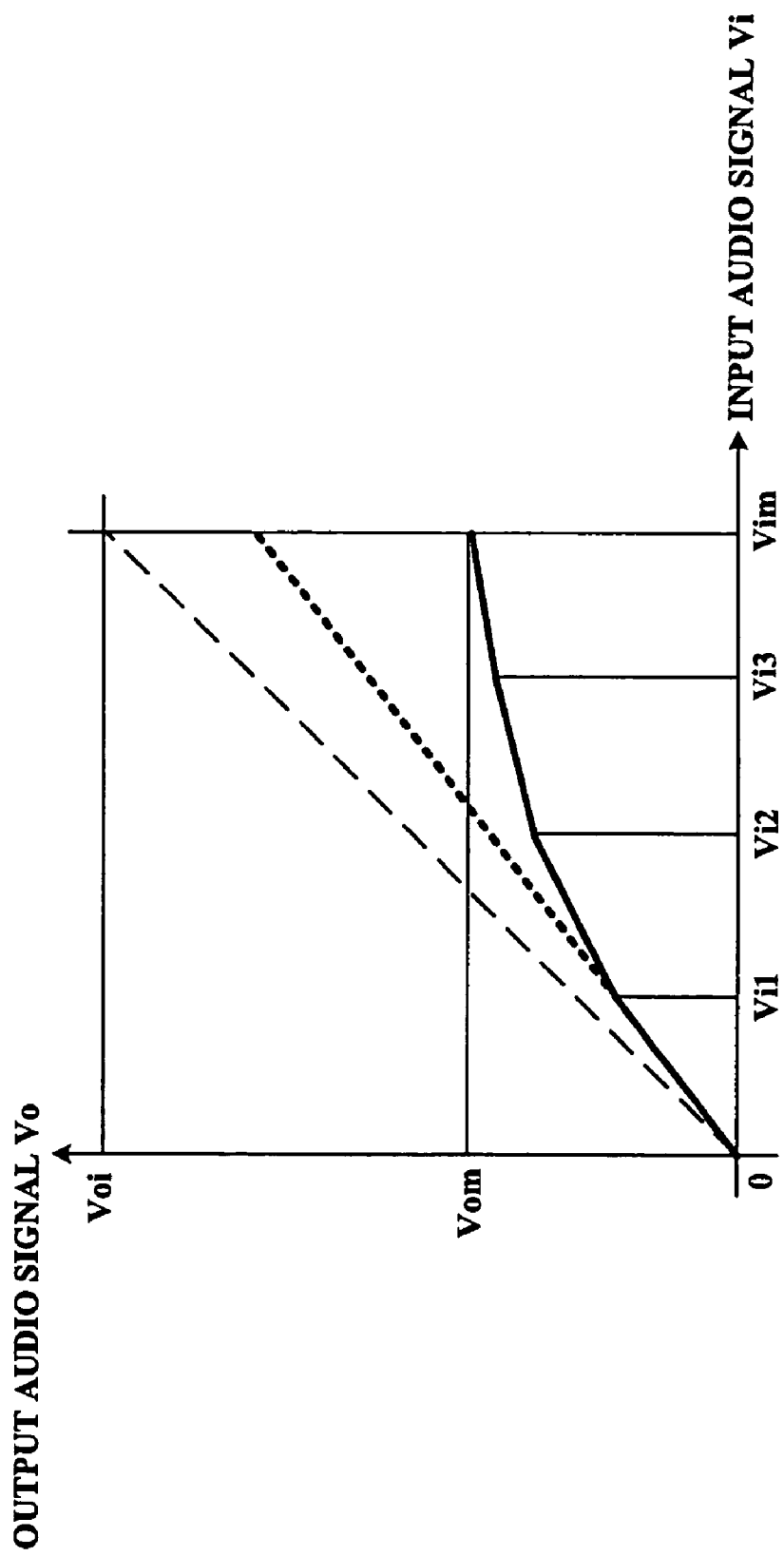
FIG. 3 is a graph of operation performance of the apparatus of FIG. 1.

FIG. 3 is a graph of operation performance of the apparatus 10. The horizontal abscissa represents an audio signal Vi input to the apparatus 10, and the vertical ordinate represents an audio signal Vo output by the apparatus 10. A value Vim of the horizontal abscissa is a maximum possible audio signal input to the apparatus 10. Values Voi and Vom of the vertical ordinate correspond to Vim, and are respectively a maximum possible unadjusted audio signal and a maximum possible attenuated audio signal output by the apparatus 10. The input audio signal Vi may correspond to a television program, an advertisement, or an unexpected noise such as interference. When the viewer selects the normal mode of the apparatus 10 through the infrared remote control device 50 or the functional key on the television itself, the MCU 1010 controls the switch 1024 to switch the circuit 102 to the normal mode. In such case, audio signals transmitted by the tuner 20 of the television are input to the switch 1024, and then transmitted to the audio processor 30 of the television. The thin, steep broken line of FIG. 3 shows a relationship between the input audio signal Vi and the output audio signal Vo of the apparatus 10 in the normal mode. In short, the audio signal Vo output by the apparatus 10 in the normal mode is same as the audio signal Vi input thereto. The output audio signal Vo is obtained by the following equation:

$$Vo=Vi (0 \leq Vi \leq Vim)$$

When the viewer selects the attenuation mode of the apparatus 10 through the infrared remote control device 50 or the functional key on the television itself, the MCU 1010 controls the switch 1024 to switch the circuit 102 to the attenuation mode. In such case, the audio signals transmitted by the tuner 20 of the television are input to the attenuation circuit 1022. If the viewer would like the input audio signal Vi to be attenuated slightly after traveling through the attenuation circuit 1022, he/she may turn off the mechanical switch S so that the input audio signal Vi travels only through the resistance R1 and the resistance R2. In such case, the thick, gentler-sloping broken line of FIG. 3 shows the relationship between the input audio signal Vi and the output audio signal Vo of the apparatus 10 in the slight attenuation mode. A lower part of this broken line is obscured by a solid line (see explanation hereinbelow). The output audio signal Vo is obtained by the following equation:

$$Vo=Vi*R2/(R1+R2) \ (S \text{ is off}; \ 0 \leq Vi \leq Vim)$$

If the viewer would like the input audio signal Vi to be attenuated significantly after traveling through the attenuation circuit 1022, he/she may turn on the mechanical switch S. According to electrical characteristics of a diode, the diode allows an input audio signal through only when a positive voltage of the input audio signal is the same as or higher than a threshold positive voltage of the diode. The threshold positive voltage is a voltage that enables the input audio signal to travel from the anode of the diode to the cathode thereof. Different diodes have different threshold positive voltages. For example, the threshold positive voltage of a silicon diode is typically 0.5V, whereas the threshold positive voltage of a germanium diode is typically 0.1V. A value Vi1 of FIG. 3 represents an input audio signal that the diode D1 (or the diode D2) barely allows through. A value Vi2 of FIG. 3 represents an input audio signal that the diodes D1, D3, D4 (or the diodes D2, D5, D6) barely allow through simultaneously. A value Vi3 of FIG. 3 represents an input audio signal that the diodes D1, D3, D4, D7, D8, D9 (or the diodes D2, D5, D6, D10, DI1, D12) barely allow through simultaneously.

Accordingly, when the input audio signal Vi is lower than the value Vi1, it is not allowed through by any one of the diodes D1, D2, D3, D4, D5, D6, D7, D8, D9, D10, D11, D12. In such case, the input audio signal Vi travels through the resistances R1, R2. When the input audio signal Vi is between the value Vi1 and the value Vi2, it is allowed through only by the diode D1 (or the diode D2.) In such case, the input audio signal Vi travels through the resistances R1, R2, R3. When the input audio signal Vi is between the value Vi2 and the value Vi3, it is allowed through by the diodes D1, D3, D4 (or the diodes D2, D5, D6.) In such case, the input audio signal Vi travels through the resistances R1, R2, R3, R4. When the input audio signal Vi is between the value Vi3 and the value Vim, it is allowed through by the diodes D1, D3, D4, D7, D8, D9 (or the diodes D2, D5, D6, D10, D11, D12.) In such case, the input audio signal Vi travels through the resistances R1, R2, R3, R4, R5. Thus, the solid line of FIG. 3 shows the relationship between the input audio signal Vi and the output audio signal Vo of the apparatus 10 in the significant attenuation mode. The output audio signal Vo is obtained by the following equations:

$$Vo=Vi*R2/(R1+R2) \ (S \text{ is on}; \ 0 \leq Vi \leq Vi1)$$

$$Vo = Vi*R33/(R1+R33) \ (S \ is \ on; \ Vi1 < Vi \leq Vi2)$$

$$Vo = Vi*R44/(R1+R44) \ (S \ is \ on; \ Vi2 < Vi \leq Vi3)$$

$$Vo = Vi*R55/(R1+R55) \ (S \ is \ on; \ Vi3 < Vi \leq Vim)$$

The value R33 represents a total resistance of the parallel-connected resistances R2, R3. The value R44 represents a total resistance of the parallel-connected resistances R2, R3, R4. The value R55 represents a total resistance of the parallel-connected resistances R2, R3, R4, R5. In electronics, the more parallel-connected resistances there are, the lower the total resistance. Consequently, the following relationship holds: R2/(R1+R2)>R33/(R1+R33)>R44/(R1+R44)>R55/(R1+R55). This means that the attenuation circuit 1022 attenuates the input audio signal Vi gradually. Further, the higher the input audio signal Vi is, the more it is attenuated. The audio signal Vo output by the attenuation circuit 1022 is an attenuated audio signal. The attenuated audio signal travels through the switch 1024 and the audio processor 30, and then is broadcast by a speaker of the television after being amplified by the amplifier 40. In this way, the viewer avoids being bothered by loud advertisements or unexpected noises.

The resistances R1, R2, R3, R4, R5 may be either the same or different, according to the particular requirements of a manufacturer of the television. In addition, the number of parallel-connected resistances and their corresponding diodes may be decreased according to the particular requirements of the manufacturer. In particular, the resistance R5 and its corresponding diodes D7, D8, D9, D10, D11, D12, or/and the resistance R4 and its corresponding diodes D3, D4, D5, D6 may be omitted. Moreover, the number of parallel-connected resistances and their corresponding diodes may be increased according to the particular requirements of the manufacturer. Any additional parallel-connected resistances and their corresponding diodes have similar connections to those of the parallel-connected resistances R1, R2, R3, R4, R5 and their corresponding diodes D1, D2, D3, D4, D5, D6, D7, D8, D9, D10, D11, D12.

When the apparatus 10 is in the attenuation mode, the viewer can simultaneously adjust sound volume via the infrared remote control device 50 or a functional key on the television itself according to his/her particular requirements. In order to realize the above-described function of adjusting sound volume, the MCU 1010 controls the degree to which the amplifier 40 amplifies the audio signals. The apparatus 10 of the present invention is also applicable to other audio systems besides televisions, such as radios, CD disc players and personal stereos.

Figure 4:
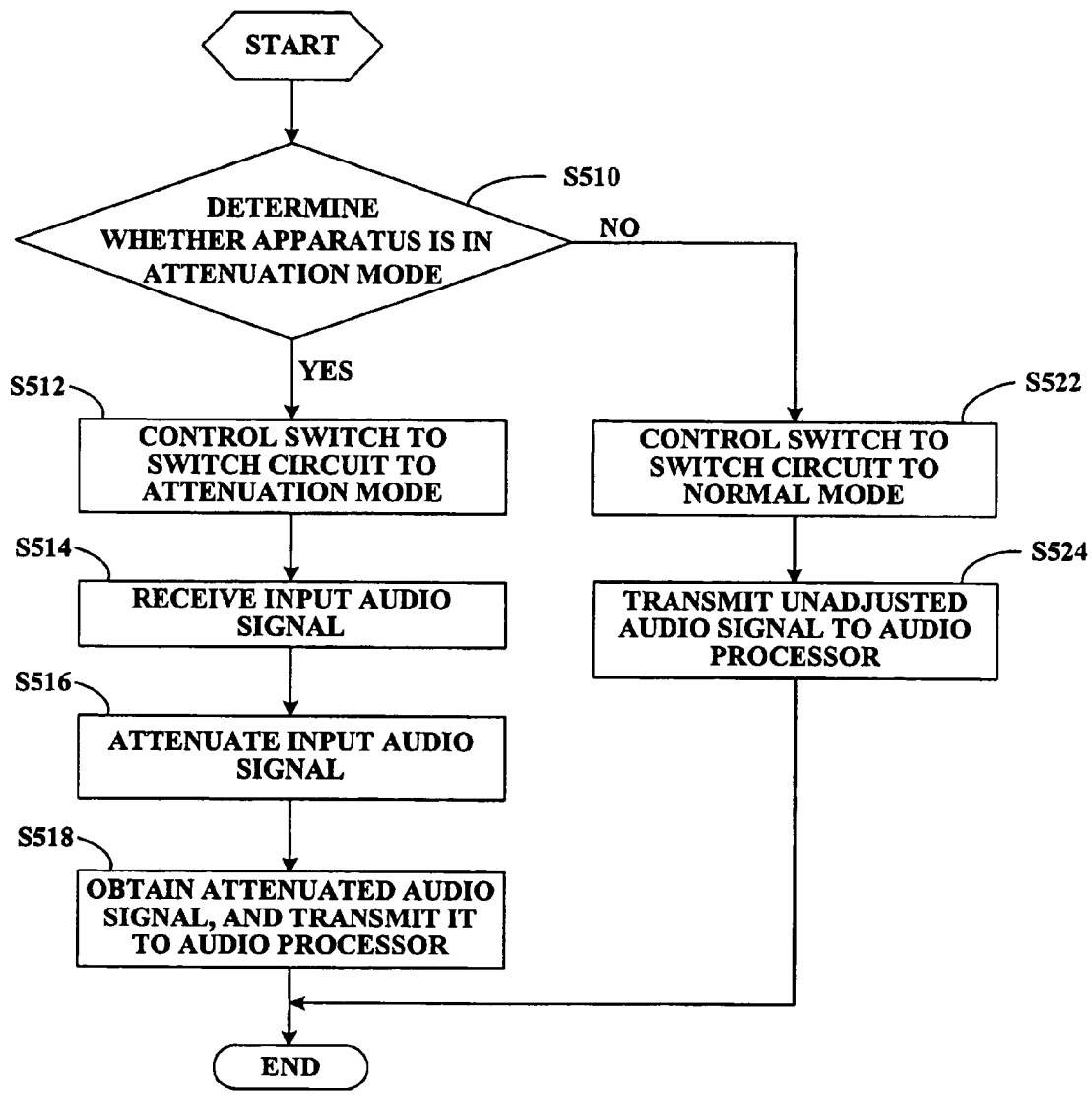
FIG. 4 is a flow chart of an exemplary method for adjusting sound volume according to the present invention.

FIG. 4 is a flow chart of an exemplary method for adjusting sound volume according to the present invention. A viewer selects an operating mode of the apparatus 10 via the infrared remote control device 50 or a functional key on the television itself. At step S510, the MCU 1010 determines whether the apparatus 10 is in the attenuation mode. If so, the procedure goes to step S512 described below. Otherwise, the procedure goes to step S522. At step S522, the MCU 1010 controls the switch 1024 to switch the circuit 102 to the normal mode. Then at step S524, the switch 1024 transmits an unadjusted audio signal to the audio processor 30, whereupon the procedure is ended. At step S512, the MCU 1010 controls the switch 1024 to switch the circuit 102 to the attenuation mode. At step S514, the attenuation circuit 1022 receives the input audio signal. At step S516, the attenuation circuit 1022 attenuates the input audio signal. If the mechanical switch S is off, the input audio signal travels through the resistances R1, R2. If the mechanical switch S is on, the input audio signal travels through three or more of the resistances R1, R2, R3, R4, R5, depending on the level of the positive voltage of the input audio signal. The input audio signal travels through the resistances R1, R2, R3 if the diode D1 or the diode D2 allows the input audio signal through. The input audio signal travels through the resistances R1, R2, R3, R4 if the diodes D1, D3, D4 or the diodes D2, D5, D6 allow the input audio signal through. The input audio signal travels through the resistances R1, R2, R3, R4, R5 if the diodes D1, D3, D4, D7, D8, D9 or the diodes D2, D5, D6, D10, D11, D12 allow the input audio signal through. At step S518, the switch 1024 obtains the attenuated audio signal from the attenuation circuit 1022, and transmits the attenuated audio signal to the audio processor 30.

The above-described procedure is repeated continually from the time the viewer turns on the television until the time the viewer turns off the television.

While a preferred embodiment and preferred method of the present invention have been described above, it should be understood that they have been presented by way of example only and not by way of limitation. Thus the breadth and scope of the present invention should not be limited by the above-described exemplary embodiment and method, but should be defined only in accordance with the following claims and their equivalents.

What is claimed is:

1. An apparatus for adjusting sound volume for an audio system, the apparatus comprising:
   a controller connected to an amplifier of the audio system for controlling amplification of the amplifier, the controller comprising a microprogrammed control unit (MCU); and
   a first circuit for adjusting the sound volume, the first circuit comprising:
   an attenuation circuit for attenuating input audio signals, the attenuation circuit comprising:
   a first resistance, one end of the first resistance being connected to a tuner of the audio system;
   a second resistance, one end of the second resistance being connected to another end of the first resistance, and another end of the second resistance being grounded;
   a third resistance, one end of the third resistance being connected to the other end of the first resistance;
   a first diode, the cathode of the first diode being connected to another end of the third resistance, and the anode of the first diode being grounded; and
   a second diode, the anode of the second diode being connected to the other end of the third resistance, and the cathode of the second diode being grounded; and
   a first switch, an input end of the first switch being connected to the tuner of the audio system and the other end of the first resistance, and an output end of the first switch being connected to an audio processor of the audio system.

2. The apparatus as claimed in claim 1, wherein the controller further comprises a Random-Access Memory (RAM) communicating with the MCU, and a nonvolatile memory communicating with the MCU.

3. The apparatus as claimed in claim 2, wherein the nonvolatile memory is a Read-Only Memory (ROM), an Erasable and Programmable Read-Only Memory (EPROM), an Electrically Erasable Programmable Read-Only Memory (EEPROM), or a flash memory.

4. The apparatus as claimed in claim 1, wherein the attenuation circuit further comprises a mechanical switch, one end of the mechanical switch is connected to the anode of the first diode and the cathode of the second diode, and another end of the mechanical switch is grounded.

5. The apparatus as claimed in claim 1, wherein the attenuation circuit further comprises:
   a fourth resistance, one end of the fourth resistance being connected to the other end of the first resistance;
   a third diode, the cathode of the third diode being connected to another end of the fourth resistance;
   a fourth diode, the cathode of the fourth diode being connected to the anode of the third diode, and the anode of the fourth diode being grounded;
   a fifth diode, the anode of the fifth diode being connected to the other end of the fourth resistance; and
   a sixth diode, the anode of the sixth diode being connected to the cathode of the fifth diode, and the cathode of the sixth diode being grounded.

6. The apparatus as claimed in claim 5, wherein the attenuation circuit further comprises a mechanical switch, one end of the mechanical switch is connected to the anode of the first diode, the cathode of the second diode, the anode of the fourth diode, and the cathode of the sixth diode, and another end of the mechanical switch is grounded.

7. The apparatus as claimed in claim 1, wherein the apparatus can run in either of the following two operating modes: a normal mode and an attenuation mode.

8. The apparatus as claimed in claim 7, wherein the first circuit can run in either of the following two operating modes: a normal mode and an attenuation mode.

9. The apparatus as claimed in claim 8, wherein when the apparatus is in the normal mode, the MCU controls the first switch to switch the first circuit to the normal mode.

10. The apparatus as claimed in claim 9, wherein the audio signals are input to the first switch, and then transmitted to the audio processor of the audio system.

11. The apparatus as claimed in claim 10, wherein an output audio signal of the apparatus is the same as a corresponding input audio signal thereof.

12. The apparatus as claimed in claim 8, wherein when the apparatus is in the attenuation mode, the MCU controls the first switch to switch the first circuit to the attenuation mode.

13. The apparatus as claimed in claim 12, wherein the audio signals are input to the attenuation circuit, and then transmitted to the audio processor of the audio system via the first switch.

14. A method for adjusting sound volume for an audio system comprising a controller and an attenuation circuit which comprises a first resistance, a second resistance, a third resistance, a first diode and a second diode, the method comprising the following steps:
   (a) determining by the controller whether an apparatus for adjusting sound volume is in an attenuation mode;
   (b) controlling a first switch by the controller to switch a circuit for adjusting sound volume to an attenuation mode, if the apparatus for adjusting sound volume is in the attenuation mode;
   (c) attenuating an input audio signal by the attenuation circuit in a first fixed ratio, the input audio signal traveling through the first resistance and the second resistance if the first diode and the second diode do not allow the input audio signal through;
   (d) attenuating the input audio signal by the attenuation circuit in a second fixed ratio, the input audio signal traveling through the first resistance, the second resistance and the third resistance if the first diode or the second diode is turned on by the input audio signal and allows the input audio signal through; and
   (e) repeating steps (a) through (d) until the audio system is turned off.

15. The method as claimed in claim 14, further comprising the following step: (b1) controlling the first switch to switch the circuit for adjusting sound volume into a normal mode, if the apparatus for adjusting sound volume is not in the attenuation mode.

16. The method as claimed in claim 15, wherein step (b1) further comprises the following step: (b2) transmitting an unadjusted audio signal to an audio processor of the audio system.

17. A method for controlling volume of audio signals in an audio system comprising a tuner and an attenuation circuit, the method comprising the steps of:
   said tuner receiving input audio signals in said audio system;
   said attenuation circuit attenuating volume of said input audio signals by turning on a first diode or a second diode and traveling said input audio signal through a first resistance, a second resistance and a third resistance in case of detection of an original input volume scale of said input audio signals larger than a first threshold value; and
   said attenuation circuit enlarging volume-attenuating of said input audio signal by turning on the first diode, a third diode and a fourth diode or turning on the second diode, a fifth diode and a sixth diode and traveling said input audio signal through the first resistance, the second resistance, the third resistance and a fourth resistance in case of detection of said original input volume scale of said input audio signals larger than a second threshold value, and said second threshold value preset larger than said first threshold value.

18. The method as claimed in claim 17, further comprising a step of repeating said enlarging volume-attenuating step by presetting a third threshold value to compare with said original input volume scale of said input audio signals.

19. The method as claimed in claim 17, wherein volume of said input audio signals is attenuated in a first fixed ratio to said original input volume scale of said input audio signals in said attenuating step, and is attenuated in a second fixed ratio to said original input volume scale of said input audio signals in said enlarging volume-attenuating step, said second fixed ratio is smaller than said first fixed ratio.

* * * * *